United States Patent
Tsubouchi et al.

(10) Patent No.: US 7,386,062 B2
(45) Date of Patent: Jun. 10, 2008

(54) BROADCASTING RECEIVER

(75) Inventors: Akinori Tsubouchi, Hyogo (JP); Mitsutaka Murakoshi, Osaka (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 757 days.

(21) Appl. No.: 10/389,758

(22) Filed: Mar. 18, 2003

(65) Prior Publication Data
US 2003/0179835 A1 Sep. 25, 2003

(30) Foreign Application Priority Data
Mar. 20, 2002 (JP) ............... 2002-078863

(51) Int. Cl.
*H03K 9/00* (2006.01)
(52) U.S. Cl. .................................... 375/316
(58) Field of Classification Search ................ 375/316, 375/324; 348/725–726, 735, 731, 733; 455/133, 455/135, 150.1
See application file for complete search history.

(56) References Cited

U.S. PATENT DOCUMENTS

| | | | | |
|---|---|---|---|---|
| 5,640,213 A | * | 6/1997 | Miyahara et al. ........... 348/726 |
| 5,999,572 A | * | 12/1999 | Komatsu ..................... 375/316 |
| 6,016,170 A | * | 1/2000 | Takayama et al. .......... 348/731 |
| 6,343,209 B1 | * | 1/2002 | Maeda et al. ............ 455/160.1 |
| 6,556,251 B1 | * | 4/2003 | Sorensen .................... 348/564 |
| 2001/0033625 A1 | * | 10/2001 | Ninomiya et al. .......... 375/316 |

FOREIGN PATENT DOCUMENTS

| | | |
|---|---|---|
| JP | 5-137086 | 6/1993 |
| JP | 9-37173 | 2/1997 |
| JP | 2001-238148 | 8/2001 |

* cited by examiner

*Primary Examiner*—Khanh C. Tran
(74) *Attorney, Agent, or Firm*—Westerman, Hattori, Daniels & Adrian, LLP.

(57) ABSTRACT

A digital tuner performs, when it receives a command to tune in on a digital broadcasting channel by a remote control signal, processing for tuning in on the digital broadcasting channel by the command. A broadcasting receiver enters a digital broadcasting received/video displayed state by the digital tuner. At this time, in an analog tuner, a local oscillation frequency on a channel at the time of viewing is not maintained but is changed and set to a frequency for selecting the highest channel 125 in CATV, thereby preventing interference with the digital tuner.

4 Claims, 2 Drawing Sheets

BROADCASTING RECEIVER

BACKGROUND OF THE INVENTION

Field of the Invention

The present invention related to a broadcasting receiver capable of receiving both digital broadcasting and analog broadcasting.

A broadcasting receiver that receives a terrestrial digital broadcasting wave selects any one of a plurality of broadcasting waves received through a terrestrial wave antenna by a digital tuner, selects any one (a transport stream) of a plurality of channels (services) included in the selected broadcasting wave by demultiplex processing, extracts a digital signal on the selected channel, and decodes the extracted digital signal, to output a video/audio signal. It is possible to construct a digital-analog broadcasting receiver comprising such a digital tuner for receiving digital television broadcasting as well as a conventional analog tuner for receiving analog broadcasting.

When the frequency bands of the digital broadcasting wave and the analog broadcasting wave are approximately the same, however, receiving obstruction may arise by interference between tuners. For example, a local oscillation frequency produced on the side of one of the tuners approximates a frequency to be received by the other broadcasting wave.

SUMMARY OF THE INVENTION

In view of the foregoing circumstances, an object of the present invention is to provide a broadcasting receiver that makes it preventable to receive interference between tuners.

A broadcasting receiver according to the present invention is characterized by comprising an analog broadcasting receiving unit for receiving an analog broadcasting wave; a digital broadcasting receiving unit for receiving a digital broadcasting wave; and control means for changing, at the time of switching from the received state of one of the broadcasting waves to the receiving of the other broadcasting wave, a local oscillation frequency in the broadcasting receiving unit for receiving the one broadcasting wave to a frequency at which no interference occurs.

Particularly, the broadcasting receiver may be so configured that at the time of switching from the received state of the analog broadcasting wave to the receiving of the digital broadcasting wave, the local oscillation frequency in the broadcasting receiving unit for receiving the analog broadcasting wave is changed to a frequency higher than the frequency of the highest channel in digital broadcasting.

Alternatively, the broadcasting receiver may be so configured that at the time of switching from the received state of the analog broadcasting wave to the receiving of the digital broadcasting wave, the local oscillation frequency in the broadcasting receiving unit for receiving the analog broadcasting wave is controlled such that the highest channel is selected.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described on the basis of FIGS. 1 and 2.

Figure 1:
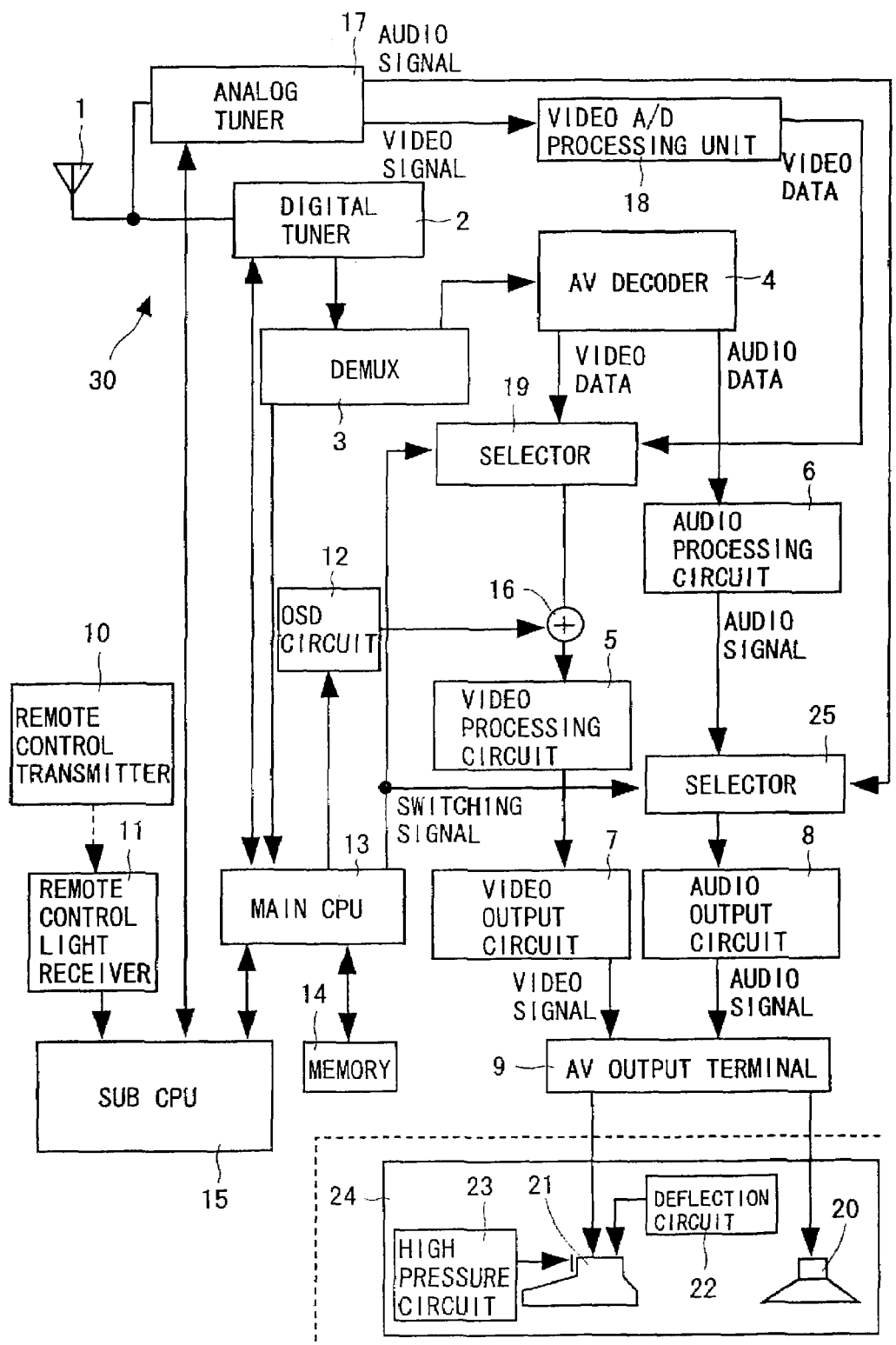
FIG. 1 is a block diagram showing a broadcasting receiver 30 according to the present embodiment capable of viewing both terrestrial wave digital broadcasting and terrestrial wave analog broadcasting.

In FIG. 1, an antenna 1 is arranged in a predetermined direction outdoors, and receives a terrestrial broadcasting wave sent from a terrestrial wave broadcasting station.

A digital tuner (used for ATSC (Advanced TV System Committee) and receiving an air wave (AIR: 2 to 69 CH) in the present embodiment) 2 extracts, out of high-frequency digital modulation signals including video/audio data, the signal having a particular frequency. An intermediate frequency IF is set to 44.0 MHz, and a local oscillation frequency is set to 101 to 847 MHz. Further, the digital tuner 2 comprises an inverse interleave circuit, an error correcting circuit, and so on, to demodulate the selected digital modulation signal and output a transport stream.

A demultiplexer (DEMUX) 3 separates the transport stream into a video stream and an audio stream based on MPEG2 (Moving Picture Experts Group2) and PSI/SI (Program Specific Information/Service Information). The demultiplexer 3 feeds the video stream and the audio stream to an AV decoder 4, and feeds to a main CPU 13 service information (the name of a program, the details of the program, the time when the program begins, a time period during which the program is continued, etc.) included in the PSI/SI. A plurality of channels (services) are multiplexed on the transport stream. Processing for selecting any of the channels can be performed by extracting from the PSI/SI data indicating which packet ID in the transport stream is used to multiplex the arbitrary channel. Further, the transport stream can be selected on the basis of the information in the PSI/SI.

The AV decoder 4 comprises a video decoder for decoding the video stream and an audio decoder for decoding the audio stream. The video decoder decodes an inputted variable length code to find a quantization factor and a motion vector, thereby carrying out inverse DCT (Discrete Cosine Transformation) and motion compensation control based on the motion vector, for example. The audio decoder decodes an inputted coded signal, to produce audio data. Video data produced by the decoding is outputted to a video processing circuit 5 through a selector 19, and the audio data is outputted to an audio processing circuit 6.

The video processing circuit 5 receives the video data and subjects the received video data to digital-to-analog (D/A) conversion, to generate a video signal (a composite signal, a Y/C signal, a component signal, etc.), and feeds the video signal to a video output circuit 7. The audio processing circuit 6 receives the audio data outputted from the AV decoder 4 and subjects the received audio data to digital-to-analog (D/A) conversion, to generate an analog audio signal.

The selector 19 selects either the video data based on digital broadcasting outputted from the AV decoder 4 or the video data based on analog broadcasting outputted from a video A/D (Analog-to-Digital) processing unit (an NTSC decoder) 18, and feeds the selected video data to the video processing circuit 5. On the other hand, a selector 25 is used for an analog signal, selects either the analog audio signal outputted from the audio processing circuit 6 or the analog audio signal outputted from the analog tuner 17 and feeds the selected analog audio signal to the audio output circuit 8.

Each of the video output circuit 7 and the audio output circuit 8 comprises an output resistor, an amplifier, and so on. An AV output terminal 9 is provided with an output unit (a set of a left/right audio output terminal or the like and a video output terminal or the like). A monitor 24 connected to the AV output terminal 9 comprises an image receiving unit comprising a deflection circuit 22 and a high pressure circuit 23 for driving a CRT (Cathode Ray Tube) 21, a speaker 20, and so on.

An analog tuner (used for NTSC (National Television System Standard Committee) and receiving an air wave (AIR: 2 to 69 CH) and CABLE (CABLE: 1 to 125 CH) in the present embodiment) 17 performs processing such as channel selection processing for selecting a signal having a frequency corresponding to a channel selected by a user and processing for demodulating the selected signal, to generate an analog video signal and an analog audio signal. Here, an intermediate frequency (IF) is set to 45.75 MHz, and a local oscillation frequency is set to 101 to 847 MHz.

A video A/D (analog-to-digital) processing unit (an NTSC decoder) 18 comprises an A/D conversion circuit, and so on, and digitizes the analog video signal received from the analog tuner 17, generates video data in the same form as that of the video data outputted by the AV decoder 4, and feeds the generated video data to the selector 19.

An OSD (On-Screen Display) circuit 12 outputs to an adder 16 bit map data based on character information which it is instructed to output from the main CPU 13. The adder 16 performs processing for incorporating the above-mentioned bit map data into the video data outputted from the selector 19. By the OSD circuit 12, a menu screen, an operation guide screen, etc. can be also displayed in addition to realizing the display of an EPG (Electronic Program Guide) screen based on service information received by the main CPU 13.

The main CPU 13 carries out control of a channel selection command to the digital tuner 2, an existent station channel search, etc., control of write/read of existent channel information and data for OSD to a memory (e.g., EEPROM (Electrically Erasable and Programmable ROM)) 14, control of the demultiplexer 3, control of the AV decoder 4, control of the OSD circuit 12, a switching command to the selectors 19 and 25, and communication with a sub CPU 15, described later, for example.

A remote control transmitter 10 is a transmitter for sending out a command to the broadcasting receiver 30. When a key (not shown) provided in the remote control transmitter 10 is operated, signal light (a remote control signal) meaning a command corresponding to the key is sent out from a light emitting unit (not shown) A remote control light receiver 11 receives the signal light, converts the received signal light into an electric signal, and feeds the electric signal to the sub CPU 15.

The sub CPU 15 carries out processing for inputting the remote control signal by the remote control transmitter 10 and a signal generated by a key operation of an operation unit (not shown) to notify the main CPU 13 of the signal and control of the analog tuner 17.

The sub CPU 15 notifies, when it receives a command to tune in on a digital broadcasting channel by the remote control signal, the main CPU 13 of the command, and gives a command to select Channel 125 in CABLE (CATV (Cable Television)) to the analog tuner 17 (applies a tuning voltage). By such processing, the broadcasting receiver 30 enters a digital broadcasting received/video displayed state by the digital tuner 2. In the analog tuner 17, a local oscillation frequency is changed and set to a frequency for selecting the highest channel 125 in CATV.

Figure 2:
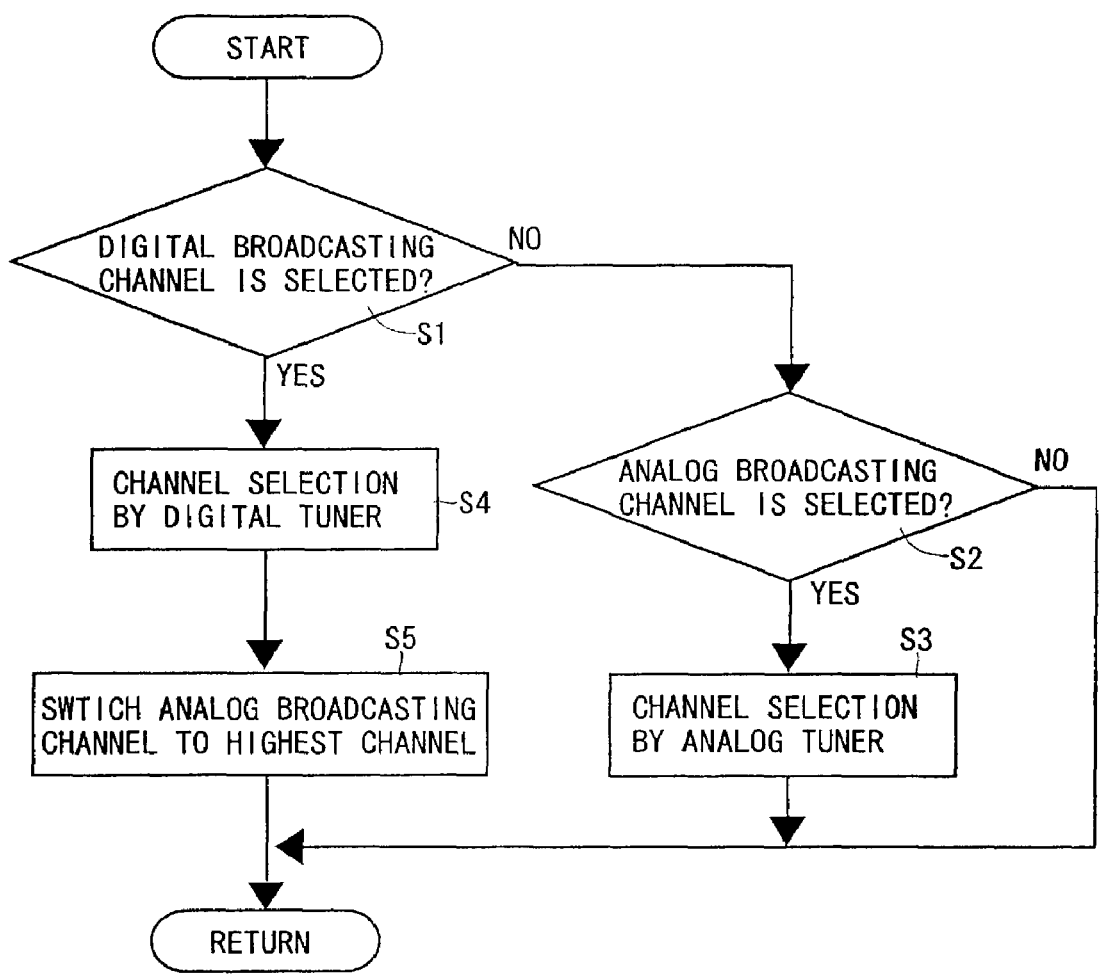
FIG. 2 is a flow chart showing the contents of processing at the time of switching the receiving of analog broadcasting/digital broadcasting.

The series of processing is shown in a flow chart of FIG. 2. It is first judged whether or not a digital broadcasting channel is selected (step S1). If the answer is in the negative, it is judged whether or not an analog broadcasting channel is selected (step S2). Also in this case, if the answer is in the negative, the procedure is returned. On the other hand, if the answer is in the affirmative, channel selection processing is performed by the analog tuner 17 (step S3). When it is judged in the step S1 that the answer is in the affirmative, channel selection processing is performed by the digital tuner 2 (step S4), and the channel in the analog tuner 17 is switched to the highest channel 125 in CATV (step S5) The analog broadcasting channel which has not been switched to the digital broadcasting channel is previously stored in the memory, to return to the original analog broadcasting channel in the case of switching from digital broadcasting received state to the receiving of analog broadcasting.

The broadcasting frequency of the highest channel 125 in CATV is 799.25 MHz, for example, and the local oscillation frequency in the analog tuner 17 is 845.00 MHz. If it is assumed that the broadcasting frequency of the highest channel 69 in digital broadcasting is approximately 500 MHz, it is not affected by the local oscillation frequency 845.00 MHz in the analog tuner 17. The same is true for the receiving of the lower channels in digital broadcasting. Channel switching processing in the analog tuner 17 is performed toward the higher frequency side than the highest channel in digital broadcasting. Accordingly, the local oscillation frequency in the analog tuner 17 does not affect the receiving of digital broadcasting even if higher harmonics which is two times or three times the local oscillation frequency in the analog tuner 17 is considered.

Although in the above-mentioned example, description was made of an example in which the channel in the analog tuner 17 at the time of receiving digital broadcasting is switched to the highest channel 125 in CATV, the present invention is not limited to the same. For example, the switching channel may be set to Channel 124 in CATV or may be a channel having a higher frequency than the highest channel 125 in CATV, provided that the channel switching processing in the analog tuner 17 is performed toward the higher frequency side than the highest channel in digital broadcasting.

In switching the channel in the analog tuner 17 at the time of receiving digital broadcasting, a channel in analog broadcasting which does not interfere with the selected channel in digital broadcasting is suitably selected in conformity with the selected channel in digital broadcasting (including a case where the local oscillation frequency in the analog tuner 17 is within a frequency range in digital broadcasting). However, it is desirable that a particular channel (e.g., the highest channel 125 in CATV) is set. On the side of the analog tuner 17, therefore, control for tuning in on the particular channel may be uniformly carried out at the time of receiving digital broadcasting, thereby simplifying a control program.

Although in the above-mentioned example, the analog broadcasting channel is switched to the highest channel 125 in CATV when it is switched to the digital broadcasting channel, digital broadcasting channel may be switched to a channel on which there occurs no interference when it is conversely switched to the analog broadcasting channel. In the case of return from the analog broadcasting received state to the receiving of digital broadcasting, however, the local oscillation frequency is set again in receiving the original digital broadcasting channel, to perform video decoding or the like. Correspondingly, the display of the video on the screen is delayed. Accordingly, it is desirable to employ such a configuration that channel change processing for avoiding interference is not performed on the side of the digital tuner 2.

As described in the foregoing, according to the present invention, the effect of making interference between tuners insusceptible to avoid receiving obstruction is produced in the broadcasting receiver comprising the analog tuner and the digital tuner.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A broadcasting receiver, comprising:
an analog broadcasting receiving unit for receiving an analog broadcasting wave;
a digital broadcasting receiving unit for receiving a digital broadcasting wave; and
control means for changing, at the time of switching from the received state of one of the broadcasting waves to the receiving of the other broadcasting wave, a local oscillation frequency in the broadcasting receiving unit for receiving said one broadcasting wave to a frequency at which no interference occurs,
wherein said analog broadcasting receiving unit and said digital broadcasting receiving unit respectively receive said analog broadcasting wave and digital broadcasting wave concurrently,
wherein at the time of switching from the received state of the analog broadcasting wave to the receiving of the digital broadcasting wave, the local oscillation frequency in the broadcasting receiving unit for receiving the analog broadcasting wave is changed to a frequency higher than the frequency of the highest channel in digital broadcasting.

2. A broadcasting receiver, comprising:
an analog broadcasting receiving unit for receiving an analog broadcasting wave;
a digital broadcasting receiving unit for receiving a digital broadcasting wave; and
control means for changing, at the time of switching from the received state of one of the broadcasting waves to the receiving of the other broadcasting wave, a local oscillation frequency in the broadcasting receiving unit for receiving said one broadcasting wave to a frequency at which no interference occurs,
wherein said analog broadcasting receiving unit and said digital broadcasting receiving unit respectively receive said analog broadcasting wave and digital broadcasting wave concurrently,
wherein at the time of switching from the received state of the analog broadcasting wave to the receiving of the digital broadcasting wave, the local oscillation frequency in the broadcasting receiving unit for receiving the analog broadcasting wave is controlled such that the highest channel is selected.

3. A broadcasting receiver comprising:
an analog broadcasting receiving unit for receiving an analog broadcasting wave;
a digital broadcasting receiving unit for receiving a digital broadcasting wave; and
control means for changing, at the time of switching from the received state of one of the broadcasting waves to the receiving of the other broadcasting wave, a local oscillation frequency in the broadcasting receiving unit for receiving said one broadcasting wave to a frequency at which no interference occurs,
wherein at the time of switching from the received state of the analog broadcasting wave to the receiving of the digital broadcasting wave, the local oscillation frequency in the broadcasting receiving unit for receiving the analog broadcasting wave is changed to a frequency higher than the frequency of the highest channel in the digital broadcasting.

4. A broadcasting receiver comprising:
an analog broadcasting receiving unit for receiving an analog broadcasting wave;
a digital broadcasting receiving unit for receiving a digital broadcasting wave; and
control means for changing, at the time of switching from the received state of one of the broadcasting waves to the receiving of the other broadcasting wave, a local oscillation frequency in the broadcasting receiving unit for receiving said one broadcasting wave to a frequency at which no interference occurs,
wherein at the time of switching from the received state of the analog broadcasting wave to the receiving of the digital broadcasting wave, the local oscillation frequency in the broadcasting receiving unit for receiving the analog broadcasting wave is controlled such that the highest channel is selected.

\* \* \* \* \*